United States Patent [19]
Lee et al.

[11] Patent Number: 6,103,601
[45] Date of Patent: Aug. 15, 2000

[54] METHOD AND APPARATUS FOR IMPROVING FILM STABILITY OF HALOGEN-DOPED SILICON OXIDE FILMS

[75] Inventors: Peter W. Lee, Fremont; Stuardo Robles, Sunnyvale; Anand Gupta, San Jose; Virendra V. S. Rana, Los Gatos; Amrita Verma, Santa Clara, all of Calif.

[73] Assignee: Applied Materials, Inc., Santa Clara, Calif.

[21] Appl. No.: 09/330,247

[22] Filed: Jun. 10, 1999

Related U.S. Application Data

[62] Division of application No. 08/548,391, Oct. 26, 1995, abandoned.

[51] Int. Cl.⁷ .......................... H01L 21/425; H01L 21/31; H01L 21/469
[52] U.S. Cl. .......................... 438/513; 438/774; 438/783; 438/787; 438/763
[58] Field of Search .................................. 438/515, 513, 438/783, 787, 778, 763

[56] References Cited

U.S. PATENT DOCUMENTS

| | | | |
|---|---|---|---|
| 4,300,989 | 11/1981 | Chang | 204/164 |
| 4,668,365 | 5/1987 | Foster et al. | 204/192.23 |
| 4,681,653 | 7/1987 | Purdes et al. | 156/614 |
| 4,717,586 | 1/1988 | Ishihara et al. | 427/39 |
| 4,818,563 | 4/1989 | Ishihara et al. | 427/55 |
| 4,854,263 | 8/1989 | Chang et al. | 118/715 |
| 4,872,947 | 10/1989 | Wang et al. | 156/643 |
| 4,894,352 | 1/1990 | Lane et al. | 437/238 |
| 5,013,691 | 5/1991 | Lory et al. | 437/238 |
| 5,156,881 | 10/1992 | Okano et al. | 427/572 |
| 5,215,787 | 6/1993 | Homma | 427/248.1 |
| 5,275,977 | 1/1994 | Otsubo et al. | 437/235 |
| 5,286,681 | 2/1994 | Maeda et al. | 437/240 |
| 5,288,518 | 2/1994 | Homma | 427/255.1 |
| 5,334,552 | 8/1994 | Homma | 437/195 |
| 5,385,763 | 1/1995 | Okano et al. | 427/572 |
| 5,399,529 | 3/1995 | Homma | 437/195 |
| 5,403,630 | 4/1995 | Matsui et al. | 427/583 |
| 5,407,529 | 4/1995 | Homma | 156/643 |
| 5,413,967 | 5/1995 | Matsuda et al. | 437/235 |
| 5,420,075 | 5/1995 | Homma et al. | 437/195 |
| 5,429,995 | 7/1995 | Nishiyama et al. | 437/238 |
| 5,571,578 | 11/1996 | Kaji et al. | 427/579 |
| 5,661,093 | 8/1997 | Ravi et al. | 438/763 |

FOREIGN PATENT DOCUMENTS

| | | | |
|---|---|---|---|
| 0 496 543 B1 | 4/1998 | European Pat. Off. | H01L 21/316 |
| 61-276977 | 12/1986 | Japan | C23C 16/50 |
| 4-239750 | 8/1992 | Japan | H01L 21/90 |
| 4-341568 | 11/1992 | Japan | C23C 16/40 |
| 5-047758 | 2/1993 | Japan | H01L 21/3205 |
| WO 92/20833 | 5/1991 | WIPO | C23C 16/00 |

OTHER PUBLICATIONS

S. Takeishi et al., "Stabilizing Dielectric Constants of Fluorine–Doped–SiO2 Films by N2O–plasma Annealing," DUMIC Conference—Feb. 21–22, 1995, pp. 257–259 (Feb. 1995).

D. Carl et al., "The Effect of $O_2$:$C_2F_6$ Ratios and Low Frequency Power on the Gap Fill Properties and Stability of F–TEOS Films," DUMIC Conference—Feb. 21–22, 1995, pp. 234–240 (Feb. 1995).

(List continued on next page.)

*Primary Examiner*—Mary Wilczewski
*Assistant Examiner*—James Park
*Attorney, Agent, or Firm*—Townsend & Townsend & Crew

[57] ABSTRACT

A fluorine-doped silicate glass (FSG) layer having a low dielectric constant and a method of forming such an insulating layer is described. The FSG layer is treated with a post-treatment step to make the layer resistant to moisture absorption and outgassing of fluorine atoms. In one embodiment, the post-treatment step includes forming a thin, undoped silicate glass layer on top of the FSG layer, and in another embodiment, the stability of the FSG film is increased by a post-treatment plasma step.

27 Claims, 10 Drawing Sheets

OTHER PUBLICATIONS

N. Hayasaka et al., "High–Quality and Low Dielectric Constant $SiO_2$ CVD Using High Density Plasma," 1993 Dry Process Symposium, pp. 163–168 (1993).

K. Musaka et al., "Single Step Gap Filling Technology for Subhalf Micron Metal Spacings on Plasma Enhanced TEOS/$O_2$ Chemical Vapor Deposition System," Extended Abstracts of the 1993 International Conference on Solid State Devices and Materials, Makuhari, pp. 510–512 (1993).

D. Yu et al., "Step Coverage Study of Peteos Deposition for Intermetal Dielectric Applications," VMIC Conference—Jun. 12–13, 1990, pp. 166–172 (Jun. 1990).

A. M. Hoff et al., "Thermal Oxidation of Silicon in an Afterglow Gas," Ctr. of Elect. Materials and Devices, Penn. State, pp. 1–4 (undated).

T. Fukuda et al., "Preparation of SiOf Films with Low Dielectric Constant by ECR Plasma CVD," DUMIC Conference—Feb. 21–22, 1995, pp. 43–49 (Feb. 1995).

L. Q. Qian et al., "High Density Plasma Deposition and Deep Submicron Gap Fill with Low Dielectric Constant SiOF Films," DUMIC Conference—Feb. 21,22, 1995, pp. 50–56 (Feb. 1995).

T. Matsuda et al., "Dual Frequency Plasma CVD Fluorosilicate Glass Deposition for 0.25 $\mu$m Interlevel Dielectrics," DUMIC Conference—Feb. 21–22, 1995, pp. 22–28 (Feb. 1995).

R. K. Laxman, "Low $\epsilon$ Dielectrics: CVD Fluorinated Silicon Dioxides," *Semiconductor International*, pp. 71–74 (May 1995).

D. A. Webb, "Silicon Dioxide Films Produced by PECVD of TEOS and TMCTS," Proceedings of the Second International Symposium on Ultra Large Scale Integration Science and Technology—ULSI Science and Technology, Proceedings vol. 89–9, pp. 571–585 (1989).

M. J. Shapiro et al., "Dual Frequency Plasma CVD Fluorosilicate Glass Water Absorption and Stability," DUMIC Conference—Feb. 21–22, 1995, pp. 118–123 (Feb. 1995).

D. Yu et al., "Step Coverage Study of PETEOS Deposition for Intermetal Dielectric Applications," 1990 Proceedings of the Seventh International IEEE VLSI Multilevel Interconnection Conference—Jun. 12–13, 1990, pp. 166–172 (Jun. 1990).

T. Usami et al., "Low Dielectric Constant Interlayer Using Fluorine–doped Silicone Oxide," *Japanese Journal of Applied Physics*, vol. 33, part 1, No. 1B, pp. 408–412 (Jan. 1994).

H. Kudo et al., "Densified SiOF Film Formation For Preventing Water Absorption," *Japanese Journal of Applied Physics*, vol. 35, part 1, No. 2B, pp. 1583–1587 (Feb. 1996).

W. Hermann et al., "Refractive Index of Doped and Undoped PCVD Bulk Silica," *Mat. Res. Bull.*, vol. 24, No. 9, pp. 1083–1097 (Jun. 1989).

S. Mizuno et al., "Improved Gap–Filling Capability of Fluorine–Doped PECVD Silicon Oxide Film," Proceedings of the Fifth International Symposium of Ultra Large Scale Integration Science and Technology—ULSI Science and Technology, Proceedings vol. 95–5, pp. 318–326 (Jan. 1995).

W.S. Yoo et al., "Intermetal Dielectric Gap Fill By Plasma Enhanced Chemical Vapor Deposited Fluorine–Doped Silicon Dioxide Films," *Japanese Journal of Applied Physics*, vol. 35, part 2, No. 3A, pp. L273–L275 (Mar. 1996).

C. Falcony et al. "High Quality, High Deposition Rate $SiO_2$ Films At Low Temperatures Using Silicon Fluorides and Plasma Assisted Deposition Techniques," *J. Vac. Sci. Technol.*, vol. 11, No. 6, pp. 2945–2949 (Nov./Dec. 1993).

S. Mizuno et al., "Dielectric Constant and Stability Doped PECVD Silicon Oxide Thin Films," Electrochemical Society Proceedings, vol. 95–5, pp. 354–364 (1995).

H. Kito et al., "Formation of SiOF Films By PECVD Using $(C_2H_5O)_3SiF$," *Extended Abstracts of 1995 International Conference on Solid State Devices and Materials*, Osaka, pp. 160–162 (1995).

METHOD AND APPARATUS FOR IMPROVING FILM STABILITY OF HALOGEN-DOPED SILICON OXIDE FILMS

This application is a divisional patent application and claims the benefit of U.S. application Ser. No. 08/548,391, filed Oct. 26, 1995, now abandoned, the disclosure of which is incorporated by reference.

BACKGROUND OF THE INVENTION

The present invention relates to the deposition of dielectric layers during wafer processing and more specifically to a method and apparatus for forming halogen-doped layers having a low dielectric constant and high film stability.

One of the primary steps in the fabrication of modern semiconductor devices is the formation of a thin film on a semiconductor substrate by chemical reaction of gases. Such a deposition process is referred to as chemical vapor deposition or "CVD". Conventional thermal CVD processes supply reactive gases to the substrate surface where heat-induced chemical reactions take place to produce a desired film. The high temperatures at which some thermal CVD processes operate can damage device structures having metal layers. Plasma enhanced CVD (frequently referred to as PECVD) processes on the other hand, promote excitation and/or disassociation of the reactant gases by the application of radio frequency (RF) energy to a reaction zone proximate the substrate surface, thereby creating a plasma of highly-reactive species. The high reactivity of the released species reduces the energy required for a chemical reaction to take place, and thus lowers the required temperature for such CVD processes. The relatively low temperature of a PECVD process makes such processes ideal for the formation of insulating layers over deposited metal layers.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer fabrication plants are routinely producing 0.5 and even 0.35 micron feature size devices, and tomorrow's plants soon will be producing devices having even smaller geometries.

As device sizes become smaller and integration density increases, issues which were not previously considered important by the industry are becoming of paramount concern. With the advent of multilevel metal technology in which three, four, or more layers of metal are formed on the semiconductors, one goal of semiconductor manufacturers is lowering the dielectric constant of insulating layers such as intermetal dielectric layers deposited by PECVD methods. Low dielectric constant films are particularly desirable for intermetal dielectric (IMD) layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine into a silicon oxide layer. An example of halogen incorporation is described in U.S. Ser. No. 08/344,283 commonly assigned to Applied Materials, Inc. filed on Nov. 24, 1994 and incorporated herein by reference. Fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluoro silicate glass films or FSG for short.

In addition to decreasing the dielectric constant, incorporating fluorine in intermetal silicon oxide layers also helps solve common problems encountered in fabricating smaller geometry devices, such as filling closely spaced gaps on semiconductor structures. It is believed that because fluorine is an etching species, fluorine doping introduces a deposition/etch/deposition effect on oxide formation. The deposition/etch/deposition effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. A problem with the incorporation of fluorine in silicon oxide or similar films, however, has been keeping the fluorine in the film. Experiments have shown only a certain level of fluorine is retained in a silicon oxide layer, even when the gas flow of the fluorine containing source gas is increased during the CVD process.

At least two separate forces effect the fluorine retention rate. The first is that FSG films absorb moisture easily. Clean rooms have a ambient moisture in the air. When a wafer is exposed to the ambient in a clean room, for example, when the wafer is passed to a new processing chamber after deposition of the oxide layer, the FSG layer absorbs moisture, thus increasing the film's dielectric constant. The absorbed moisture ($H_2O$) also reacts with the fluorine to form hydrofluoric acid (HF).

Another problem with FSG films occurs when the film is exposed to a thermal process such as an anneal process. The high temperature of the thermal processes can move the fluorine atoms out of the oxide layer through metal or other subsequently deposited layers. The excursion of fluorine atoms in this manner is referred to as outgassing.

From the above, it can be seen that an oxide film having a low dielectric constant is necessary to keep pace with emerging technologies. It can also be seen that a method is needed to prevent moisture absorption and outgassing in fluorine-doped oxide films.

SUMMARY OF THE INVENTION

The present invention solves the above problems of the prior art by providing an insulating layer having a low dielectric constant that is resistant to moisture absorption and outgassing of dopant atoms. The invention also provides a method and apparatus for forming such an insulating layer.

In one embodiment of the method of the present invention, a capping layer is formed on a halogen-doped silicon oxide film by introducing a separate silicate glass layer over the oxide layer. In a preferred version of this embodiment, the separate layer is an undoped silicate glass (USG) layer formed in a plasma enhanced CVD deposition chamber. The USG layer in this embodiment is relatively thin and thus does not effect the bulk film properties of the halogen-doped silicon oxide layer. In a still further preferred version of this embodiment the halogen-doped silicon oxide film is an FSG film.

Another embodiment of the method of the present invention forms a USG layer over an FSG or similar halogen-doped silicon oxide layer by stopping the flow of the halogen-containing source before deposition of the oxide layer is completed. Without the halogen-containing source present at the end of formation of the halogen-doped silicon oxide layer, a small USG cap is formed on the layer that is sufficient to prevent moisture absorption and outgassing without effecting bulk film properties. The halogen-doped silicon oxide layer comprises an FSG layer in a preferred embodiment.

A further embodiment of the method of the present invention treats an FSG or similar halogen-doped silicon oxide layer with a plasma post-treatment step to improve film stability. In one version of this embodiment, a plasma from a nitrogen containing source is used to treat the FSG film. It is believed that the nitrogen plasma treatment forms an overlying, layer on the FSG layer densifying that layer and preventing moisture absorption and outgassing without effecting bulk film properties. In another version of this embodiment, a plasma from an inert gas such as argon is employed to densify the bulk FSG layer. In still another version of this embodiment, a plasma from a hydrogen containing source gas is used to bombard an FSG film with hydrogen ions. It is believed that the hydrogen ions remove loosely bound fluorine atoms from the FSG film so that the loosely bound fluorine atoms do not outgas during subsequent processing. In another version, the plasma post-treatment step includes forming a plasma from a hydrogen containing and nitrogen containing source such as $NH_3$. These and other embodiments of the present invention, as well as its advantages and features are described in more detail in conjunction with the text below and attached figures.

DETAILED DESCRIPTION OF THE PREFERRED EMBODIMENTS

I. Exemplary CVD Reactor Chamber

Figure 1:
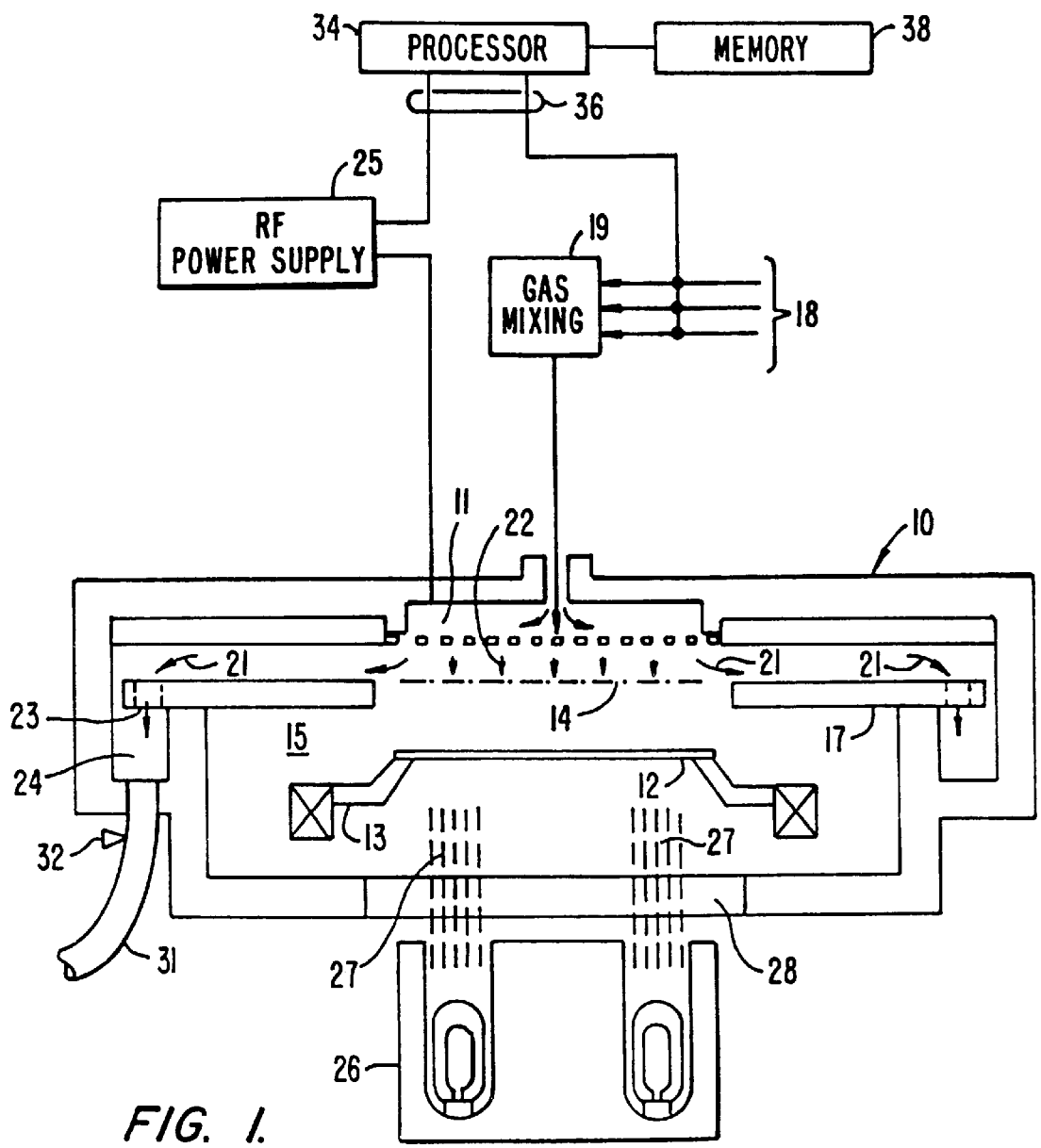
FIG. 1 is a vertical, cross-sectional view of one embodiment of a simplified chemical vapor deposition apparatus according to the present invention.

FIG. 1 illustrates one embodiment of a simplified, parallel plate plasma enhanced chemical vapor deposition (PECVD) reactor 10 having a vacuum chamber 15 in which the dielectric layer according to the present invention can be deposited. Reactor 10 contains a gas distribution manifold 11 for dispersing deposition gases to a wafer, not shown, that rests on a susceptor 12. Susceptor 12 is highly thermally responsive and is mounted on supports 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. Deposition and carrier gases and liquids are supplied through lines 18, having control valves not shown, into a gas mixing chamber 19 where they are combined and then sent to manifold 11. During processing, gas inlet to manifold 11 is vented toward and uniformly distributed radially across the surface of the wafer as indicated by arrows 22 and 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

A controlled plasma is formed adjacent to the wafer by RF energy applied to manifold 11 from RF power supply 25. Gas distribution manifold 11 is also an RF electrode, while susceptor 12 is grounded. RF power supply 25 can supply either single or mixed frequency RF power (or other desired variation) to manifold 11 to enhance the decomposition of reactive species introduced into chamber 15.

A circular external lamp module 26 provides a collimated annular pattern of light 27 through quartz window 28 onto susceptor 12. Such heat distribution compensates for the natural heat loss pattern of the susceptor and provides rapid thermal and uniform susceptor and wafer heating for effecting deposition.

A motor, not shown, raises and lowers susceptor 12 between a processing position 14 and a lower, wafer-loading position. The motor, control valves connected to lines 18, throttle valve and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned.

The above reactor description is mainly for illustrative purposes and should not be considered as limiting the scope of the present invention. Variations of the above described reactor such as variations in susceptor design, heater design, location of RF power connections and others are possible. Additionally, other plasma CVD equipment such as electron cyclotron resonance (ECR) plasma CVD devices, induction coupled RF high density plasma CVD devices, or the like may be employed. Additionally, thermal CVD equipment may also be used for formation of the halogen-doped bulk film layer. The dielectric layer and method for forming such a layer of the present invention is not limited to any specific apparatus or to any specific plasma excitation method.

II. Exemplary Fluoro Silicate Glass Deposition

According to the process of the present invention, the bulk of a halogen-doped silicon oxide layer may be formed using any of several different processes. The process recipes of two FSG films, one using triethoxyfluorosilane (hereinafter referred to as "TEFS") as a fluorine source and one using $C_2F_6$ as a fluorine source, are set forth below as examples. Further details on this portion of the process are also set forth in U.S. Ser. No. 08/344,283 previously mentioned.

The exemplary process may be performed in PECVD reactor 10. Of course, those of ordinary skill in the art would understand that other process recipes and other reaction chamber types may also be used to deposit the bulk FSG films.

A. TEFS-FSG Film Deposition

The exemplary TEFS-FSG bulk film is deposited by heating the wafer and susceptor to a temperature of between 200–500° C., preferably to a temperature within the range of 350–500° C. and most preferably to about 400 degrees, and maintaining this temperature range throughout the deposition. The reaction chamber is maintained at a pressure within a range of about 1–50 torr. Preferably, the pressure is maintained within the range of about 3–16 torr, and most preferably it is maintained at about 5 torr. The susceptor is positioned about 200–600 mils from the gas distribution manifold and is preferably positioned about 250 mils from the manifold.

A mixture comprising TEFS as the source of fluorine, tetraethoxysilane (hereinafter referred to as "TEOS") as the source of silicon and one or more gaseous sources of oxygen is formed. Being liquids, the TEFS and TEOS sources are vaporized and then combined with an inert carrier gas such as helium. The flow rate of TEFS is between about 200–1500 mgm and is preferably between about 300–900 mgm and is most preferably at about 850 mgm, while the TEOS flow rate is between about 400–1500 mgm and preferably about 260 mgm. The vaporized TEOS and TEFS gases then are mixed with a helium carrier gas flowing at a rate of between 400–1500 sccm and are preferably flowing at a rate of about 560 sccm. Oxygen in the form of 02 is introduced at a flow rate of between about 100–5000 sccm and is preferably introduced at a flow rate of about 1200 sccm. This mixture is introduced into the reaction chamber from the gas distribution manifold and excited into a plasma state. The plasma is formed using a frequency of 13.56 MHz at between 0–500 Watts, and preferably at about 155 Watts, and a low radio frequency of between 10 KHz to 2 MHz, preferably about 350 KHz powered at between about 0–900 Watts and preferably at about 230 Watts.

The ratio of TEFS to TEOS is between 0.33–10:1 and preferably between about 1–3:1. The total flow rate of all gaseous sources is between 500–6500 sccm and is preferably between about 1500–2500 sccm.

The above conditions result in an FSG film deposited at a rate of between 3000–7000 Å/minute having a compressive stress level of between −0.5 to −3.0*10⁹ dynes/cm², a wet etch ratio with respect to the thermal oxide film of between 3–5 for 6:1 BOE etchant and an atomic fluorine concentration of between 0.5–15. Preferably, the fluorine concentration of the resulting film is between 0.5–6% SiF as measured by Fourier transform infrared (FTIR) spectroscopy of the peak ratio of SiF bonds to SiF+SiO bonds. Most preferably the fluorine concentration of the resulting film is between 1.0–4.0% SiF.

B. $C_2F_6$-FSG Film Deposition

The exemplary $C_2F_6$-FSG bulk film is deposited by heating the wafer and susceptor to a temperature of between 200–500° C., preferably to a temperature within the range of 350–500° C. and most preferably to about 400 degrees, and maintaining this temperature range throughout the deposition. Electrode spacing ranges from about 200–600 mils, and is preferably at about 250 mils.

A gaseous mixture comprising $C_2F_6$ as the gaseous source of fluorine, TEOS as the source of silicon, and one or more gaseous sources of oxygen is introduced into the reaction chamber from the gas distribution manifold and an RF plasma is formed. The plasma is formed using a high radio frequency of 13.56 MHz at between 0–500 Watts, and preferably at about 200 Watts, and a low radio frequency of between 10 KHz to 2 MHz, preferably about 350 KHz at between about 0–900 Watts and preferably at about 430 Watts.

The TEOS source is first vaporized and then combined with an inert carrier gas such as helium. The flow rate of TEOS is between about 400–1500 mgm and preferably at a rate of about 600 mgm. After being vaporized, the TEOS gas source then is mixed with a helium carrier gas at a rate of between 400–1500 sccm and preferably at a rate of about 760 sccm. $C_2F_6$ is introduced at a flow rate of between 100–900 sccm and is preferably introduced at a rate of about 400 sccm. Oxygen in the form of $O_2$ is introduced at a rate of between about 100–5000 sccm and preferably at a rate of about 1200 sccm.

The reaction chamber is maintained at a pressure within a range of about 1–50 torr, preferably at a pressure within the range of about 3–16 torr and most preferably at a pressure of about 5 torr. The ratio of $C_2F_6$ to TEOS is between about 1–25:1 and preferably between about 5–15:1. While the total flow rate of all gaseous sources is between 500–6200 sccm and is preferably between about 2000–3000 sccm.

The above process conditions result in an FSG film deposited at a rate of between 3000–6000 Å/minute having compressive a stress level of between 0 to −2.0*10⁹ dynes/cm², a wet etch ratio with respect to the thermal oxide film of between 3–5 for 6:1 BOE etchant and an atomic fluorine concentration of between 0.5–15%. Preferably, the fluorine concentration level is between about 0.5–6% SiF and is most preferably between about 1.0–4.0% SiF.

The parameters in the above processes should not be considered limiting to the claims. One of ordinary skill in the art can also use other chemicals, chamber parameters, and conditions to produce similar films.

The present invention is also applicable to silicon oxide films doped with members of the halogen family other than fluorine. Specifically, the invention is applicable to silicon oxide films doped with chlorine or bromine. Such films may be deposited, for example, from a plasma of oxygen, TEOS and a reagent from the class of haloorganosilanes of the formula $SiX_nR_{4-n}$, where n is an integer in the range of 1–3, X is a halogen, and each R is either a hydrogen or an alkoxy group with the proviso that at least one R is an alkoxy group as described in U.S. Ser. No. 08/344,283 mentioned above. Of course, such films may be deposited by other known methods as understood by one of ordinary skill in the art.

C. The Dielectric Constant of the Exemplary FSG Films

Figure 3:
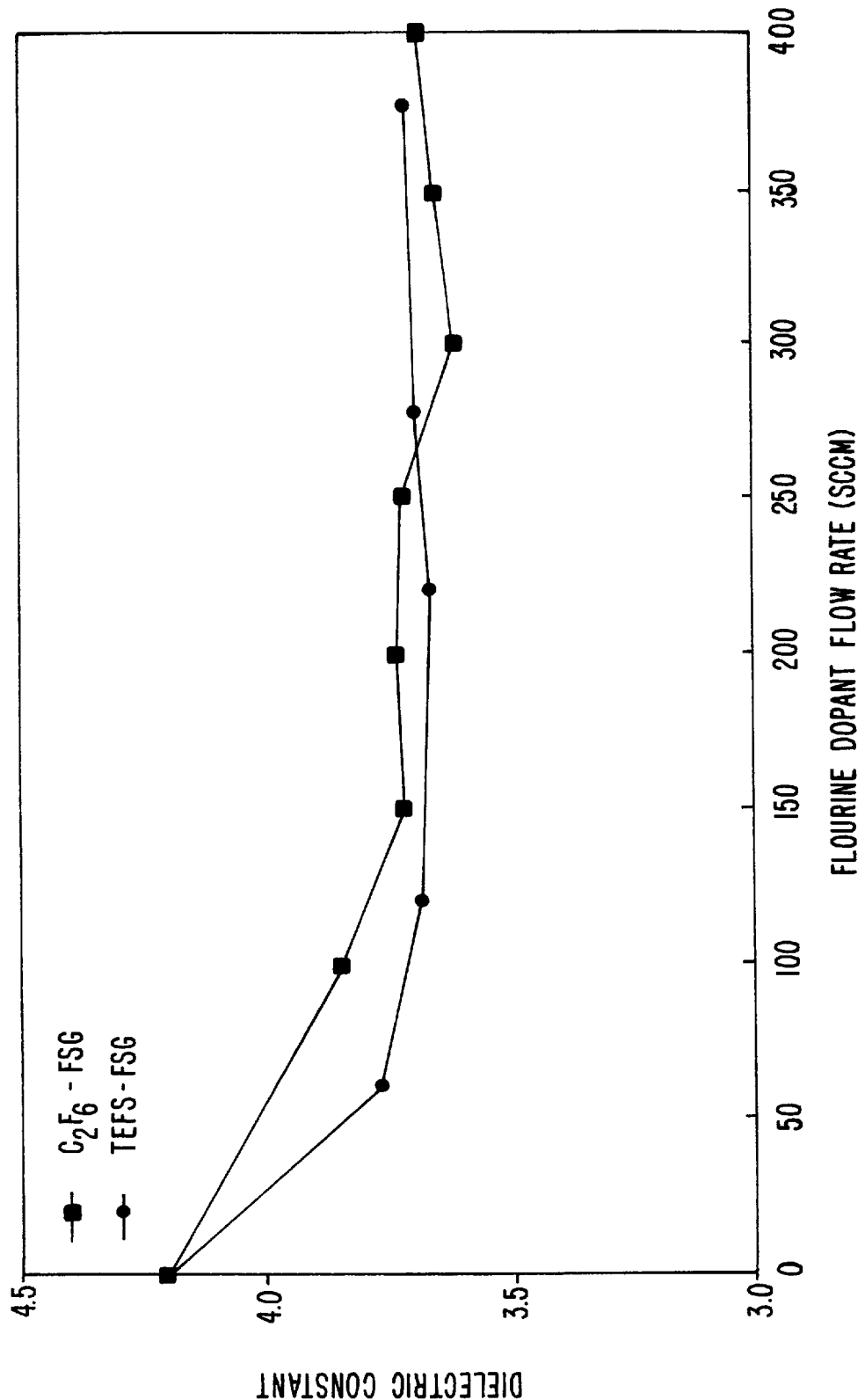
FIG. 3 is a graph showing the effect of fluorine dopant flow on the dielectric constant of FSG films.

Experiments have shown that the dielectric constant of the above TEFS-FSG and $C_2F_6$-FSG films ranges from between about 4.2 to 3.2 depending on the flow rate of the fluorine dopant and other factors. These experiments, however, also show that, for a given set of process conditions, increasing the fluorine dopant flow alone may not achieve an FSG film having the lowest dielectric constant possible. One result of these experiments is shown in FIG. 3, which is a graph showing the effect of fluorine dopant flow on the dielectric constant of TEFS-FSG and $C_2F_6$-FSG films deposited under specified process conditions as described below. The dielectric constant measurements performed in these experiments were done with a mercury probe capacitance-voltage measurement on an MOS capacitor structure as is well known to those skilled in the art.

The TEFS-FSG film having characteristics shown in FIG. 3 was deposited on a low resistivity silicon wafer at a pressure of 5 torr and a temperature of 400° C. using a high frequency of 13.56 MHz at 155 Watts and a low frequency of 350 KHz powered at 230 Watts. The susceptor was positioned 250 mils from the gas distribution manifold. TEOS was introduced at a flow rate of 260 mgm while oxygen was introduced into the chamber at a rate of 1250 sccm. TEFS was introduced at a rate of between 0–1500 mgm from an ampule, vaporized and mixed with a helium carrier gas flowing at a rate of 560 sccm.

The $C_2F_6$ film of FIG. 3 was deposited on a low resistivity silicon wafer at a pressure of 5 torr and a temperature of 400° C. A plasma was formed from the $C_2F_6$ source gas, TEOS and oxygen using a frequency of 13.56 MHz at 200 Watts, then a lower frequency of 350 KHz at 430 Watts. The susceptor was positioned 250 mils from the gas distribution manifold. TEOS was introduced at a flow rate of 260 mgm, oxygen was introduced at a rate of 1000 sccm and $C_2F_6$ was introduced at a flow rate of about 0–400 sccm.

III. Decreasing the Dielectric Constant of the Halogen-doped Silicon Oxide Layer It is believed that film stability is a limiting factor in the reduction of the dielectric constant of halogen-doped silicon oxide films such as FSG. Several methods to improve film stability and lower the dielectric constant of these films, as described below, were investigated. Each method described may be performed on a halogen-doped silicon oxide layer, after the layer is deposited using a recipe such as one of the exemplary FSG deposition recipes described above. Furthermore, although each method is described below with respect to treatment of an FSG film, the methods are equally applicable to any halogen-doped silicon oxide film.

A. Deposition of an Undoped Silicate Glass Capping Layer

According to one embodiment of the present invention, the deposited FSG layer is capped with a thin, separate undoped silicate glass (USG) layer. The USG capping layer is a stable film that does not readily absorb moisture. Thus, the USG capping layer provides a hydrophobic surface on top of the FSG layer that prevents moisture present in the ambient from being absorbed into the FSG film. Furthermore, the USG capping layer is a relatively dense film that impedes fluorine evolution.

The USG layer can be deposited in a separate processing chamber from the FSG layer, but preferably is done as an in-situ process. The wafer and susceptor are heated to a temperature within the range of about 100 to 500° C., but preferably from about 360 to 440° C. and then maintained at this temperature throughout the deposition. The susceptor is positioned about 200–400 mils away from the gas distribution manifold and preferably about 250 mils away.

A gaseous mixture comprising oxygen and silicon sources is introduced into the deposition chamber. In a preferred embodiment, the silicon source is TEOS and the oxygen source is $O_2$, but those skilled in the art will recognize that additional silicon sources such as silane ($SiH_4$), TMCT or similar sources, and other oxygen sources such as ozone, $H_2O$, $N_2O$ and similar sources and mixtures of the same also can be employed. When TEOS is used as a silicon source, a carrier gas such as helium, argon or nitrogen is employed.

The ratio of $O_2$ to TEOS may range from about 0.1–1000:1, but is preferably between about 0.3–30:1. Typically the ratio will be about 10:1.

The optimal total flow of the gaseous reactants will vary according to the geometry and design of the deposition chamber. The gas flow also can be varied to control the deposition rate. Typically, TEOS is introduced at a flow rate of between about 10 and 10,000 mgm and is preferably introduced at a flow rate of between about 500 and 1500 mgm. $O_2$ is introduced at a flow rate of between about 10 and 10,000 sccm and is preferably introduced at a flow rate of between about 500 and 1500 sccm. Helium is a typical carrier gas that is introduced at a flow rate of between 100–100,000 sccm and preferably between about 1000–10,000 sccm. Usually, the total flow of gases into the deposition chamber will vary from about 1000 to about 10,000 sccm.

Chamber pressure is maintained at a pressure of between 0.5 and 20 torr, and is preferably at a pressure of between 3 and 10 torr. Such a low pressure provides increased deposition rate and film uniformity. The plasma is formed using a frequency of 13.56 MHz at between 0–900 Watts, and preferably at about 350 Watts, and a lower frequency of between about 10 KHz to 2 MHz, preferably about 350 KHz at between about 0–500 Watts and preferably at about 100 Watts.

Under the above conditions, deposition rates of between 5000 and 10,000 Å/minute are attainable. At such deposition rates, a USG cap layer of 1000 Å can be deposited in approximately 5–20 seconds. Typical applications will have USG cap layers of between 100 and 2000 Å, and preferably between 500 and 1000 Å. A person of ordinary skill in the art, however, will realize that capping layers of different thickness can be employed depending on the specific application and device geometry size. Depending on the application in which the deposited film is used, it may be preferable, although not essential, that the capping layer be relatively thin compared to the underlying FSG layer so as to not change the bulk film properties of the FSG layer. Also, depending upon the application, a thick USG capping layer may be deposited and etched back using a technique such as chemical mechanical polishing (CMP).

A person of ordinary skill in the art will also realize that different capping layers such as thermally grown USG films, plasma enhanced or thermally grown phosphosilicate glass (PSG) or similar, stable oxide films may be utilized. In fact, if a particular application requires the use of CMP techniques, a PSG capping layer may be preferential to a USG capping layer because PSG films may be etched away faster. Preferably, the capping layer should not be limited in effectiveness by the same factors that limit the stability of the underlying FSG layer. Thus, the capping layer preferably should not be an FSG layer or similar halogen-doped film unless the fluorine or halogen content of the capping layer is substantially lower than that of the capped, bulk layer. The FSG layer according to the above embodiment of the present invention is a conformal film, having a low pin hole count, high density, compressive stress and a high wet etch rate.

B. Premature Cutoff of the Fluorine Source

According to another embodiment of the present invention, a USG or similar cap layer is formed on an FSG film by turning off the fluorine-containing gas source just before completion of deposition of the FSG layer. In this embodiment, the initial FSG layer is formed as described above. Flow of the fluorine dopant source into the reaction chamber then is stopped while the plasma remains on for an additional period of between 0.5–20 seconds. Preferably, the plasma remains on for about 0.5–10 seconds and most preferably the plasma remains on for an additional 2–5 seconds. The preferred time period should be greater than the average residence time of an individual atom (the time an atom spends in the reaction chamber) and preferably is at least twice the average residence time. In one embodiment where reactor pressure is low and reactor volume is small (approximately 5 liters), the average residence time of an individual atom is about 1.0 seconds. In this embodiment, the fluorine source is stopped by closing a valve on the source's supply line so that the plasma is maintained without a fluorine dopant for at least 2 seconds.

Of course, stopping of the fluorine source must be coordinated with the time it takes the gas to travel from the point of the valve to the gas mixing chamber and then through the faceplate of manifold 11. In most CVD machines several seconds is required for gas to flow from the injection valve to the deposition chamber, so the valve should be closed sufficiently in advance to allow for these delays.

Thus, if TEFS is the fluorine-containing gas source, closing the valve on the TEFS supply line several seconds before the completion of deposition of the FSG layer results in a thin USG cap which prevents occurrence of the previously described moisture absorption and outgassing phenomenon. Similarly, if $C_2F_6$ is the fluorine-containing gas source, closing the valve on the $C_2F_6$ supply line several seconds before the completion of deposition of the FSG layer produces a equally effective USG cap.

C. Plasma Post-Treatment Process

Still another embodiment of the present invention treats the deposited FSG layer with a post-treatment plasma step. Various gas sources can be employed for this post-treatment plasma step. In one version of this embodiment, the plasma consists of a nitrogen gas source such as nitrogen, $N_2O$ or a similar gas or combination of gases. In another version the plasma consists of a nonreactive gas source such as argon. When the plasma layer is formed from a nitrogen containing source gas, it is believed that nitrogen atoms bond in the silicon lattice to form traces of silicon nitride. It is also believed that the silicon nitride forms a hermetic seal over the underlying FSG layer, thus forming a hydrophobic film that prevents moisture absorption and is resistant to fluorine outgassing. Forming the plasma layer with a heavy gas such as argon, densifies the film. The densified film is more resistant to moisture absorption and is more resistant to fluorine outgassing.

The plasma treatment can be carried out in a separate processing chamber from the FSG layer, but preferably it is deposited in an in-situ process immediately after deposition of the FSG layer. The post-treatment plasma layer is deposited by maintaining the wafer and susceptor temperature within the range of about 25 to 600 degrees C, but preferably from about 360 to 440 degrees C. Chamber pressure is maintained at a pressure of between 0.1 and 20 torr, and is preferably kept at a pressure of between 0.5 and 5 torr. The susceptor is positioned about 200–400 mils away from the gas distribution manifold and preferably about 250 mils away.

In a preferred version of this embodiment, the plasma consists of a nitrogen containing source gas such as $N_2$ or $N_2O$. The gas is introduced into the deposition chamber at rate of between about 10 and 20,000 sccm and is preferably introduced at a flow rate of between about 500 and 3000 sccm. The optimal flow of the gas will vary according to the geometry and design of the deposition chamber and the gas may be combined with a carrier gas as appropriate.

With the high frequency (13.56 MHz) power source, power ranges from about 0 Watts to about 2000 Watts, and is preferably at about 50 Watts. In the low frequency (between about 10 KHz–2 MHz and preferably about 350 KHz) power source, power ranges from about 0 Watts to about 2000 Watts, and is preferably at about 450 Watts. Experiments have shown that use of a mixed frequency RF power source is preferable to a single, high frequency source. A mixed frequency source results in ions bombarding the film with a higher energy level, which in turn results in a denser and more stable film. Of course, the particular gases, processing parameters, and power sources used will vary according to the particular application.

In typical applications, a plasma post-treatment step of between 10 and 500 seconds, and preferably of between 20 and 100 seconds is used. The plasma post-treatment process does not change the bulk film properties of the underlying FSG layer.

The FSG film can be further densified by connecting the low frequency RF power supply to the susceptor rather than to the electrode. The ions generated in the plasma are not mobile enough to follow the high frequency RF source applied to the manifold, but are mobile enough to follow the low frequency source. Thus, ion bombardment is controlled by the low frequency source at the susceptor. Placing a low frequency DC bias on susceptor 12 moves the voltage sheath closer to the receptor and increases ion bombardment at the surface substrate. The generated ions are accelerated through the electrical gradient across the wafer at higher kinetic energy levels, resulting in formation of a denser film.

Still another version of this embodiment of the method of the present invention treats the FSG film with a post-treatment hydrogen plasma step. The plasma step bombards the FSG film with ions from a hydrogen containing source gas such as $H_2$. The hydrogen ions from the plasma act as a reducing agent removing loosely bound fluorine atoms from the FSG film. The small size of the hydrogen ions allows the ions to penetrate deep into the FSG layer and remove loosely bound fluorine atoms from both the surface and interior of the film. It is believed that the bombarded hydrogen atoms are not bonded into the FSG film. After being subjected to the hydrogen plasma, the fluorine atoms remaining in the FSG film are generally tightly bound within the film.

This method may be performed on a FSG layer, after the layer is deposited using a process such as one of the exemplary FSG deposition processes described above. Furthermore, although the hydrogen bombardment step is described below with respect to treatment of an FSG film, it is equally applicable to any halogen-doped silicon oxide film.

The hydrogen bombardment post-treatment process is performed by maintaining the wafer and susceptor temperature within the range of about 300 to 500° C., but preferably from about 400 to 480° C. Chamber pressure is maintained at a pressure of between 1 and 100 torr, and is preferably kept at a pressure of between 50 and 100 torr. The susceptor is positioned about 250–500 mils away from the gas distribution manifold and preferably about 400 mils away.

In a preferred version of this embodiment, the plasma consists of a hydrogen containing source gas such as $H_2$. The gas is introduced into the deposition chamber at rate of between about 250 and 2000 sccm and is preferably introduced at a flow rate of between about 500 and 1000 sccm. The gas may be combined with a carrier gas such as nitrogen or helium, argon, or other inert gas introduced at a rate of between about 50 and 500 sccm. The optimal flow of the gas will vary according to the geometry and design of the deposition chamber.

With the high frequency (13.56 MHz) power source, power ranges from about 0 Watts to about 2000 Watts, and is preferably at about 250 Watts. In the low frequency (between about 10 KHz–2 MHz and preferably about 350 KHz) power source, power ranges from about 0 Watts to about 2000 Watts, and is preferably at about 100 Watts. The use of a mixed frequency RF power source is preferable to a single, high frequency source. A mixed frequency source results in ions bombarding the film with a higher energy level, which in turn is more likely to remove loosely bound fluorine atoms from the bombarded FSG layer. Of course, the particular gases, processing parameters, and power sources used will vary according to the particular application.

In typical applications, a hydrogen bombardment post-treatment step is used for between 10 and 300 seconds, and preferably for between 20 and 60 seconds. Because no measurable deposition occurs, the plasma post-treatment process does not change the bulk film properties of the underlying FSG layer.

In still another version of this embodiment, the plasma step bombards the FSG film with ions from a nitrogen containing source and a hydrogen containing source. In such a step, it is believed that the hydrogen ions remove loosely bound fluorine atoms as discussed above and it is also believed that a nitrogen capping layer is formed sealing the FSG layer. In a preferred version of this embodiment, the hydrogen containing source and nitrogen containing source are from a single source gas such as ammonia ($NH_3$).

IV. Exemplary Structure

Figure 2:
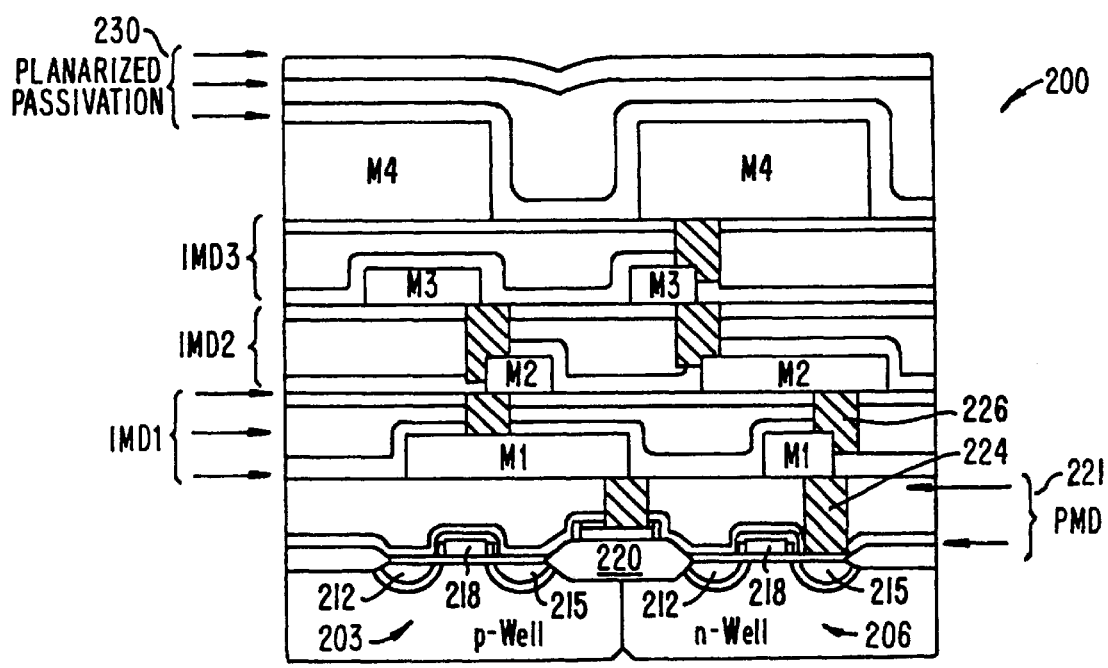
FIG. 2 is a simplified cross-sectional view of a semiconductor device manufactured according to the method of the present invention.

FIG. 2 illustrates a simplified cross-sectional view of an integrated circuit 200 according to the present invention. As shown, integrated circuit 200 includes NMOS and PMOS transistors 203 and 206, which are separated and electrically isolated from each other by a field oxide region 220. Each transistor 203 and 206 comprises a source region 212, a drain region 215 and a gate region 218.

A premetal dielectric layer 221 separates transistors 203 and 206 from metal layer M1 with connections between metal layer M1 and the transistors made by contacts 224. Metal layer M1 is one of four metal layers, M1–M4, included in integrated circuit 200. Each metal layer M1–M4 is separated from adjacent metal layers by respective inter-metal dielectric layers IMD1, IMD2 or IMD3. Adjacent metal layers are connected at selected openings by vias 226. Deposited over metal layer M4 are planarized passivation layers 230.

While the dielectric layer of the present invention may find uses in each of the dielectric layers shown in integrated circuit 200, physical properties of the film such as its low dielectric constant and good gap-fill properties along with the PECVD process used in formation of the preferred embodiments make it most useful as an insulation layer between adjacent metal layers as shown by IMD layers IMD1–IMD3. Typically, such IMD layers are between 0.2 and 3.0 microns thick.

The dielectric layer of the present invention may also be used in damascene layers which are included in some integrated circuits. In damascene layers, a blanket FSG layer is deposited over a substrate, selectively etched through to the substrate and then filled with metal and etched back or polished to form metal contacts such as M1. After the metal layer is deposited, a second blanket FSG deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits such as microprocessors, application specific integrated circuits (ASICS), memory devices, and the like.

V. Test Results and Measurements

A. Deposition of an Undoped Silicate Glass Capping Layer

To demonstrate the operation of the apparatus and method according to the embodiment of the present invention employing a USG capping layer, experiments were performed measuring the dielectric constant of FSG films manufactured without a USG capping layer and measuring the dielectric constant of FSG films with the capping layer. The uncapped FSG films were 1.0 micron thick and the capped FSG films were 1.0 micron thick with a 1000 Å USG cap. Both films were deposited on a low resistivity silicon wafer. As shown in Table 1 below, two different FSG films are illustrated: one in which the fluorine source was TEFS and one in which the fluorine source gas was $C_2F_6$. Both films were deposited in a Precision 5000 chamber manufactured by Applied Materials, Inc.

The TEFS-FSG film was deposited using a frequency of 13.56 MHz at 155 Watts and a lower frequency of 350 KHz at 230 Watts. Chamber pressure was maintained at 5 torr and the susceptor was heated to 400° C. and positioned 250 mils from the gas distribution manifold.

TEOS was introduced at a rate of 600 mgm into a liquid injection valve and mixed with a helium carrier gas flowing at a rate of 380 sccm. TEFS stored in an ampule was combined with a helium carrier gas flowing at 150 sccm. The flow rate of oxygen was 1250 sccm.

The above conditions resulted in an FSG film deposited at a rate of 6000 Å/minute, and a refractive index of 1.44. The film had a compressive stress of $-1.0*10^9$ dynes/cm$^2$ and contained 1.0% SiF bonds.

The $C_2F_6$-FSG film was deposited using a high frequency of 13.56 MHz at 200 Watts and a low frequency of 350 KHz at 430 Watts. The pressure in the processing chamber was maintained at 5 torr and the susceptor and wafer were heated to 400° C. and positioned 250 mils from the gas distribution manifold.

TEOS was introduced at a rate of 600 mgm into a liquid injection valve and mixed with a helium carrier gas at a rate of 740 sccm, while the flow rate of $C_2F_6$ was 350 sccm. Oxygen was introduced at a rate of 1000 sccm.

In each case, the USG capping layer was formed in an in-situ process immediately after the bulk FSG layer was deposited. The susceptor was heated to a temperature of 400° C., the chamber was maintained at a pressure of 5 torr, and the susceptor was positioned 250 mils from the gas distribution manifold. TEOS, oxygen and helium were introduced into the deposition chamber at flow rates of 600, 840, and 560 sccm, respectively, and a plasma was maintained using a 13.56 MHz and 350 KHz RF power supplies at 350 and 100 Watts, respectively.

The above conditions resulted in an FSG film deposited at a rate of 4500 Å/minute, having a uniformity rate of 4.0% and a refractive index of 1.42. The film had a compressive stress of $-0.6*10^9$ dynes/cm$^2$ and contained 2.5% SiF molecules.

The parameters used in the experiments should not be limiting to the claims as described herein. One of ordinary skill in the art can also use other chemicals, chamber parameters, and conditions to produce similar films.

TABLE 1

EFFECT OF CAPPING AND ANNEALING ON DIELECTRIC CONSTANT

|  | TEFS-FSG Film (FTIR % SiF: 2.5) | $C_2F_6$-FSG Film (FTIR % SiF: 2.5) |
|---|---|---|
| Plain Film deposited at 400° C. | 3.76 | 3.84 |
| Film with 1000 PE USG cap | 3.51 | 3.42 |
| Film annealed at 450° C. | 3.85 | 3.93 |
| Film annealed at 850° C. | 3.61 | [Not Tested] |
| Film deposited at 440° C. Susceptor temp. | 3.74 | [Not Tested] |

As evident from the table, the FSG films hav ing a 1000 Å USG cap deposited over the FSG layer had a lower dielectric constant than the non-capped FSG films. For the TEFS-FSG film, the dielectric constant was 3.51 as compared to 3.76, and for the $C_2F_6$-FSG film the dielectric constant was 3.42 as compared to 3.84.

Table 1 also shows that other attempts at obtaining a reduced di electric constant film were performed. These experiments concluded that subjecting the film to a 30 minute anneal step at 450° C. had no beneficial effect on the dielectric constant for either the TEFS or $C_2F_6$ film. Furthermore, while a TEFS-FSG film subjected to a 30 minute anneal at 850° C. had a decreased dielectric constant of 3.61 as compared to 3.76, IMD layers cannot be subjected to a thermal step of 850° C. without damaging underlying metal layers. Also, depositing an initial TEFS-FSG layer at an increased temperature of 440° C. resulted in a negligible decrease in the dielectric constant. Data for an 850° C. anneal for the $C_2F_6$ film and the $C_2F_6$ film deposited at 440° C. was not measured.

Figure 4:
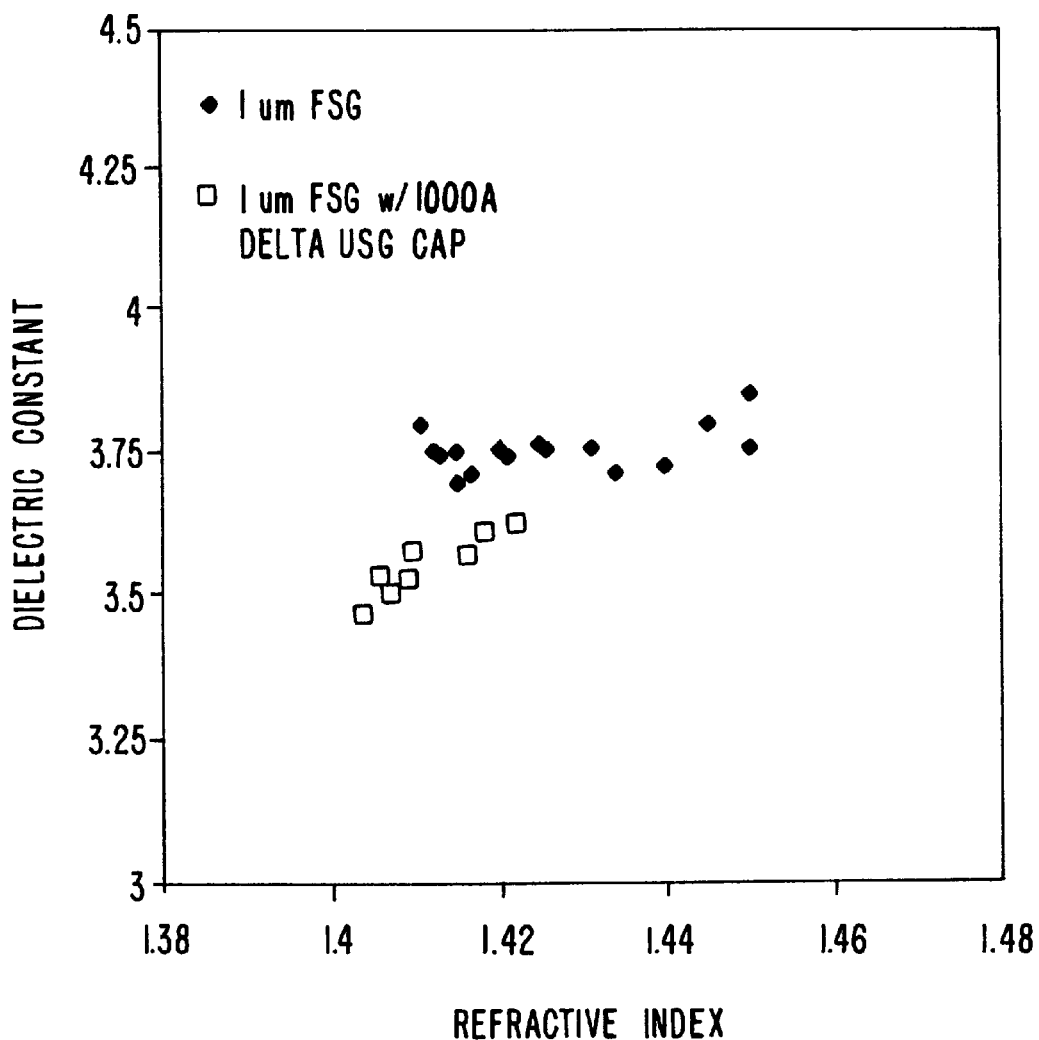
FIG. 4 is a graph illustrating experimental results showing the dielectric constant of FSG films produced according to one method of the present invention.

FIG. 4 provides additional information about the effect of the USG cap on the dielectric constant. The diamonds in FIG. 4 represent the dielectric constant for wafers having a 1.0 micron $C_2F_6$-FSG layer. Measurements were performed with a mercury probe capacitance-voltage measurement on an MOS capacitor structure, as is well known to those skilled in the art. The squares represent the measured dielectric constant for wafers having a 1000 Å USG cap As evident from FIG. 4, the dielectric constant for the capped layers was lower than the uncapped FSG layers in every case. The dielectric constant for wafers having a 1000 Å USG cap varied from between about 3.4–3.6 and averaged about 3.5. Based on simulations, an insulation layer having a dielectric constant of about 3.5 can increase device speed by about 10% over an insulation layer having a dielectric constant of about 4.2. Additionally, 3.5 dielectric constant layer film reduces device power consumption and significantly reduces cross talk.

Figure 5:
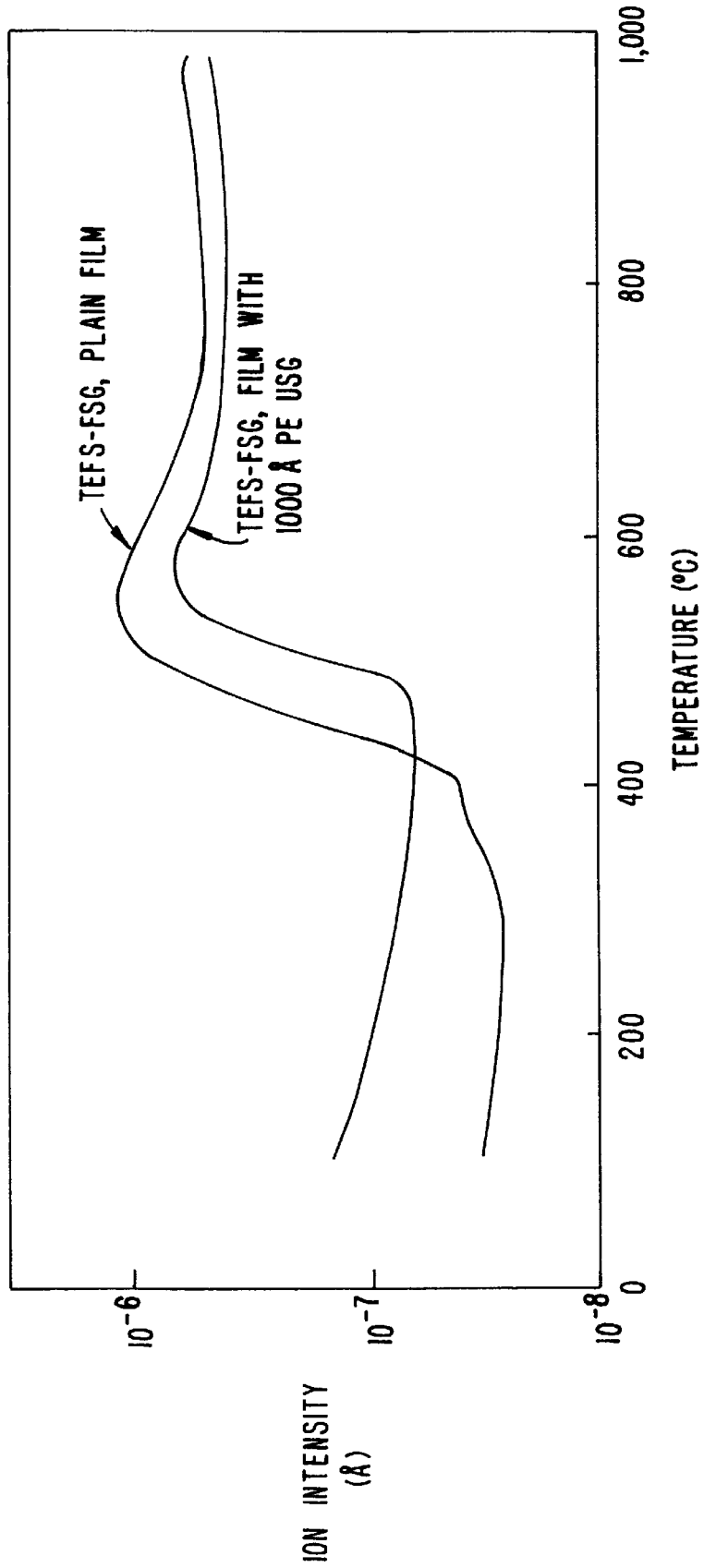
FIG. 5 is a graph of HF evolution for an uncapped FSG film and an FSG film capped with 1000 Å of USG immediately after the films were deposited.

Further evidence of the benefits of a USG cap on an FSG film is evident from FIGS. 5–8, which are graphs comparing the evolution of HF and $H_2O$ as a function of temperature in capped and uncapped FSG films based on thermal desorption spectroscopy (TDS) as well understood by those of ordinary skill in the art. FIG. 5 compares the evolution of HF (electron mass of 20) in an uncapped film FSG to the evolution of HF in a film capped with a 1000 Å USG layer immediately after deposition. The TDS data plotted in FIG. 5 shows that HF evolution begins occurring in the uncapped FSG film at approximately 400° C. which is about 75 degrees before HF evolution occurs in the capped FSG film. This difference is significant in that many thermal cycles take place at temperatures of between 400–450 degrees. Such thermal cycles, which are particularly common for IMD layers, result in outgassing of HF in an uncapped FSG layer, but do not result in outgassing in a FSG layer capped according to this embodiment of the present invention.

Figure 6:
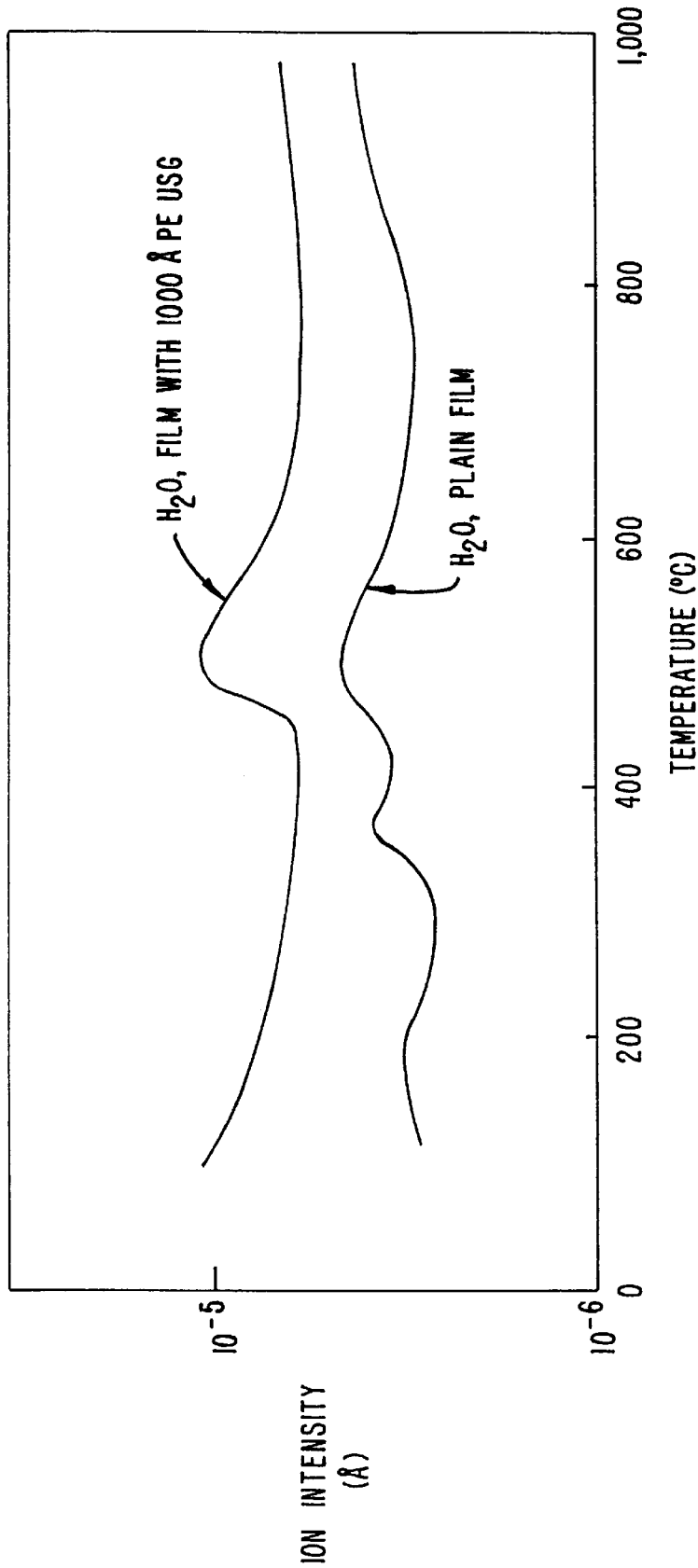
FIG. 6 is a graph of $H_2O$ evolution for an uncapped FSG film and an FSG film capped with 1000 Å of USG immediately after the films were deposited.

In FIG. 6, which compares the evolution of $H_2O$ (electron mass of 18) in an uncapped film FSG to the evolution of HF in a film capped with a 1000 Å USG layer immediately after deposition, the plotted TDS data shows that $H_2O$ evolution begins occurring in the uncapped FSG film at approximately 320° C. which is approximately 130° C. before $H_2O$ evolution occurs in the capped FSG film at 450° C.

Some of the conclusions drawn from FIGS. 5 and 6 along with other comparison data proving the benefits of an FSG film having a USG cap layer appear in Table 2. Table 2 summarizes the TDS and FTIR data for a TEFS-FSG film.

TABLE 2

TEFS-FSG: FILM STABILITY FOR AS DEPOSITED FILMS

|  | As Dep FTIR Data | Thermal Desorption Spectrum Data | | | | |
|---|---|---|---|---|---|---|
| TEFS-FSG Film Type | SiOH/SiO Ratio (%) | $H_2O$ Start (C.) | $H_2O$ Peak (C.) | HF Start T (C.) | HF Peak T (C.) | Stress Hysteresis Over 25 to 450° C. (x-E8 dynes/cm$^2$) |
| Plain Film deposited at 400° C. | 0.048 | 320 | 380 | 400 | 550 | 2.5 |
| Film with 1000 Å PE USG cap | 0.0009 | 450 | 515 | 475 | 550 | 2 |
| Film with 450° C. anneal | 0.048 | 450 | 520 | 440 | 560 | 1 |
| Film deposited at 440° C. Susceptor temp. | 0.032 | No Peak | No Peak | 480 | 600 | 2 |
| Film at 440° C., capped and annealed | 0.015 | 500 | 560 | 525 | 600 | 2 |

Figure 7:
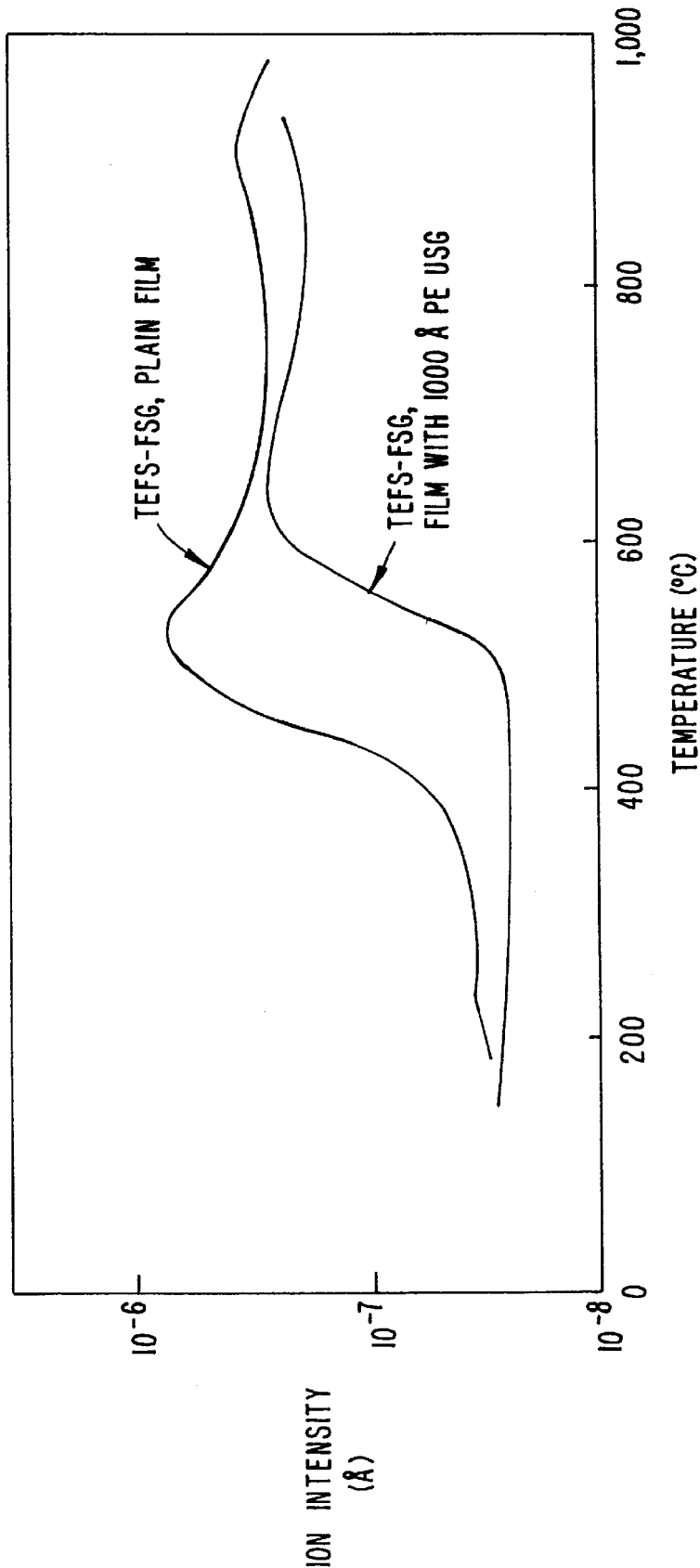
FIG. 7 is a graph of HF evolution for an uncapped FSG film and an FSG film capped with 1000 Å of USG 48 hours after the films were deposited.
Figure 8:
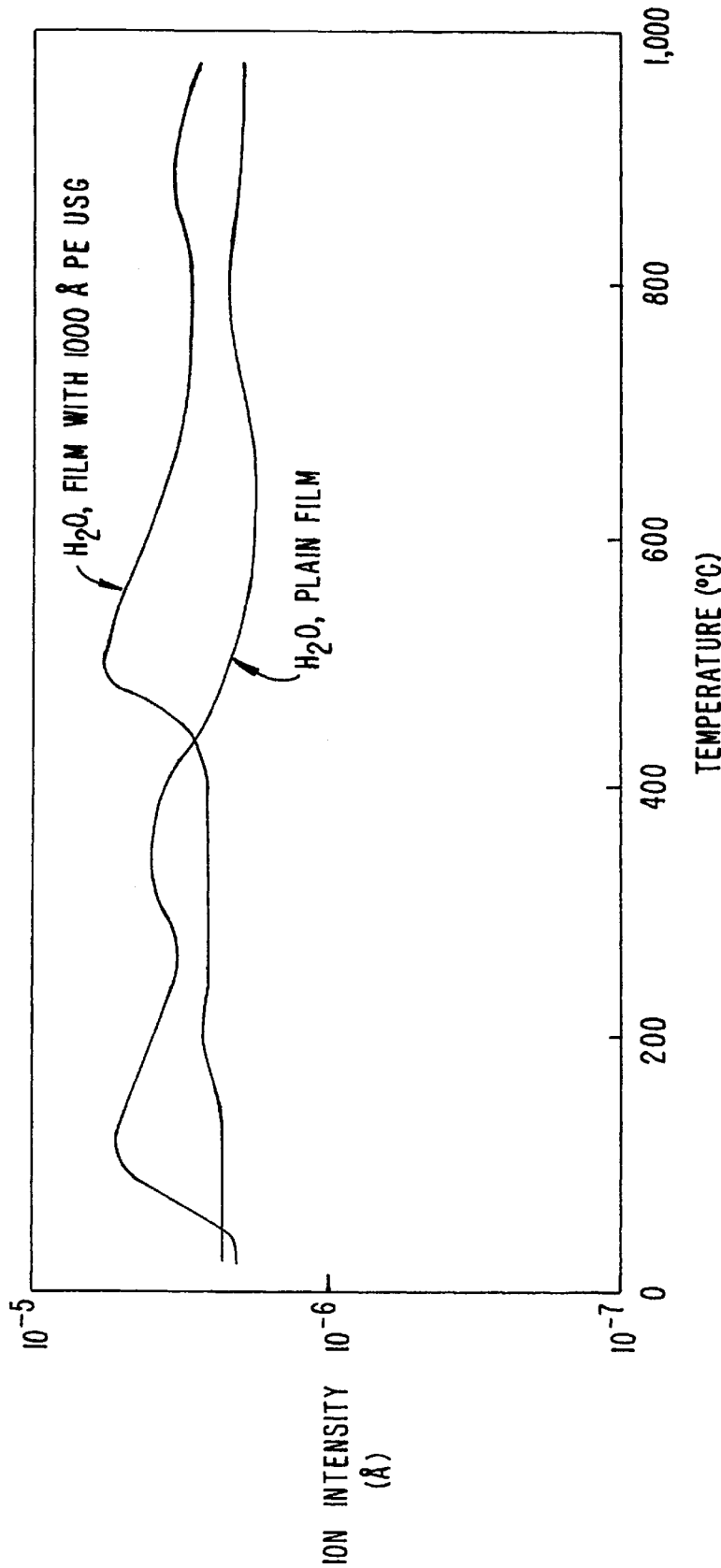
FIG. 8 is a graph of $H_2O$ evolution for an uncapped FSG film and an FSG film capped with 1000 Å of USG 48 hours after the films were deposited.

Further experiments were performed to evaluate the thermal desorption characteristics of the films after the films were exposed to ambient conditions for 48 hours. FIGS. 7 and 8 show the results of these experiments, and that the benefits derived from the USG cap layer continue, or even increase, over time. FIG. 7 is a graph comparing HF evolution in an uncapped FSG film to HF evolution in an FSG film capped with a 1000 Å USG cap after the films have been deposited for 48 hours. The TDS data plotted in FIG.

6 shows that after being deposited 48 hours, HF evolution begins occurring in the uncapped FSG film at approximately 120° C. before HF evolution occurs in the capped FSG film (360° C. as compared to 480° C.).

Similarly, in FIG. 8, which compares the evolution of $H_2O$ in an uncapped film FSG to the evolution of HF in a film capped with a 1000 Å USG layer after the films have been deposited for 48 hours, the plotted TDS data shows hat $H_2O$ evolution begins occurring in the uncapped FSG film at approximately 80° C. before $H_2O$ evolution occurs in the capped FSG film (40° C. versus 420° C.).

Some of the conclusions drawn from FIGS. 7 and 8 along with other comparison data proving the benefits of an FSG film having a USG cap layer is summarized in Table 3 below.

Figure 9:
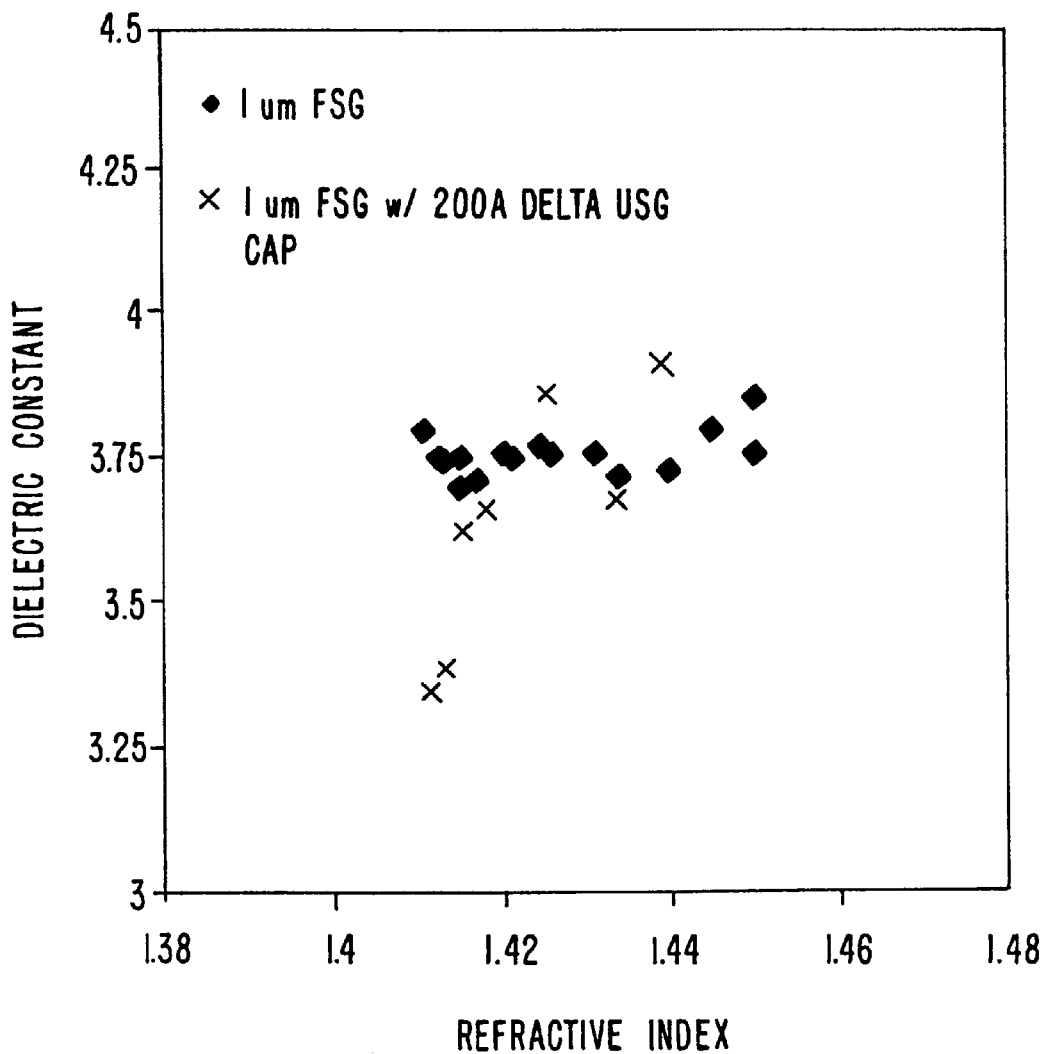
FIG. 9 is a graph illustrating experimental results showing the dielectric constant of FSG films produced according to another method of the present invention.

FIG. 9, the diamonds represent the dielectric constant for wafers having a 1.0 micron FSG layer. The x's represent the measured dielectric constant for wafers having approximately a 200 Å USG cap deposited over a 1.0 micron FSG layer.

As evident from FIG. 9, except for two instances which represent normal noise in such tests, the dielectric constant for the capped layers was lower than the uncapped FSG layers. The dielectric constant for wafers having a 200 Å USG cap varied from between about 3.3–3.8 and averaged about 3.55.

C. Post-Treatment Plasma Process

To demonstrate the operation of the apparatus and method according to the embodiment of the present invention that subjects the halogen-doped film to a hydrogen plasma

TABLE 3

TEFS-FSG: THERMAL DESORPTION OVER TIME

| TEFS-FSG Film Type | $H_2O$ Start Temp (C.) | | $H_2O$ Peak Temp (C.) | | HF Start Temp (C.) | | HF Peak Temp (C.) | |
|---|---|---|---|---|---|---|---|---|
|  | As Dep | After 48 Hrs. | As Dep | After 48 Hrs. | As Dep | After 48 Hrs. | As Dep | After 48 Hrs. |
| Plain Film deposited at 400° C. | 320 | 40 | 380 | 160 | 400 | 360 | 550 | 480 |
| Film with 1000Å PE USG cap | 450 | 420 | 515 | 500 | 475 | 480 | 550 | 580 |
| Film with 450° C. anneal | 450 | 40 | 520 | 160 | 440 | 390 | 560 | 500 |
| Film deposited at 440° C. Susceptor temp. | No Peak | 440 | No Peak | 480 | 480 | 440 | 600 | 575 |
| Film at 440° C., capped and annealed | 500 | 450 | 560 | 500 | 525 | 500 | 600 | 550 |

B. Premature Cutoff of the Fluorine Source

To demonstrate the operation of the apparatus and method according to the embodiment of the present invention that prematurely terminates the fluorine containing source, experiments were performed measuring the dielectric constant of $C_2F_6$-FSG films manufactured without cutting off the fluorine source and measuring the dielectric constant of $C_2F_6$-FSG films having a USG capping layer formed by shutting off the fluorine source. The uncapped FSG films were 1.0 micron thick and the capped FSG films were 1.0 micron thick with a USG cap approximately 200 Å thick. Both films were deposited on a low resistivity silicon wafer in a Precision 5000 chamber manufactured by Applied Materials, Inc.

The $C_2F_6$-FSG film was deposited using a high frequency of 13.56 MHz at 200 Watts and a low frequency of 350 KHz at 430 Watts. The pressure in the processing chamber was maintained at 5 torr and the susceptor and wafer were heated to 400° C. and positioned 250 mils from the gas distribution manifold. TEOS was introduced at a rate of 260 mgm into a liquid injection valve and mixed with a helium carrier gas introduced into the chamber at a rate of 740 sccm. The flow rate of $C_2F_6$ was 350 sccm, and oxygen was introduced at a rate of 1000 sccm.

The process conditions for the capped film were identical to the uncapped film except that the flow of the $C_2F_6$ source was stopped 2 seconds prior to completion of deposition of the FSG layer.

The results of these experiments are shown in FIG. 9, which is a graph illustrating experimental results showing the decreased dielectric constant of FSG films produced according to this embodiment of the present invention. In treatment, experiments were performed measuring the evolution of $H_2O$ from FSG films treated with a hydrogen plasma step and those not treated with such a step. Both films were deposited on a low resistivity silicon wafer and were 0.1 micron thick. Both films were deposited in a Precision 5000 chamber manufactured by Applied Materials, Inc.

The FSG films were $C_2F_6$-FSG films deposited using a high frequency of 13.56 MHz at 200 Watts and a low frequency of 350 KHz at 430 Watts. The pressure in the processing chamber was maintained at 5 torr and the susceptor and wafer were heated to 400° C. and positioned 250 mils from the gas distribution manifold. TEOS was introduced at a rate of 260 mgm into a liquid injection valve and mixed with a helium carrier gas at a rate of 740 sccm, while the flow rate of $C_2F_6$ was 350 sccm. Oxygen was introduced at a rate of 1000 sccm.

The hydrogen bombardment step was formed in an in-situ process immediately after the bulk FSG layer was deposited. The susceptor was heated to a temperature of 400° C., the chamber was maintained at a pressure of 90 torr, and the susceptor was positioned 400 mils from the gas distribution manifold. Hydrogen was introduced into the deposition chamber at a flow rate of 700 sccm mixed with a carrier gas introduced at a flow rate of about 50 sccm, and a plasma was maintained using a 13.56 MHz and 350 KHz RF power supplies at 250 and 0 Watts, respectively.

Figure 10:
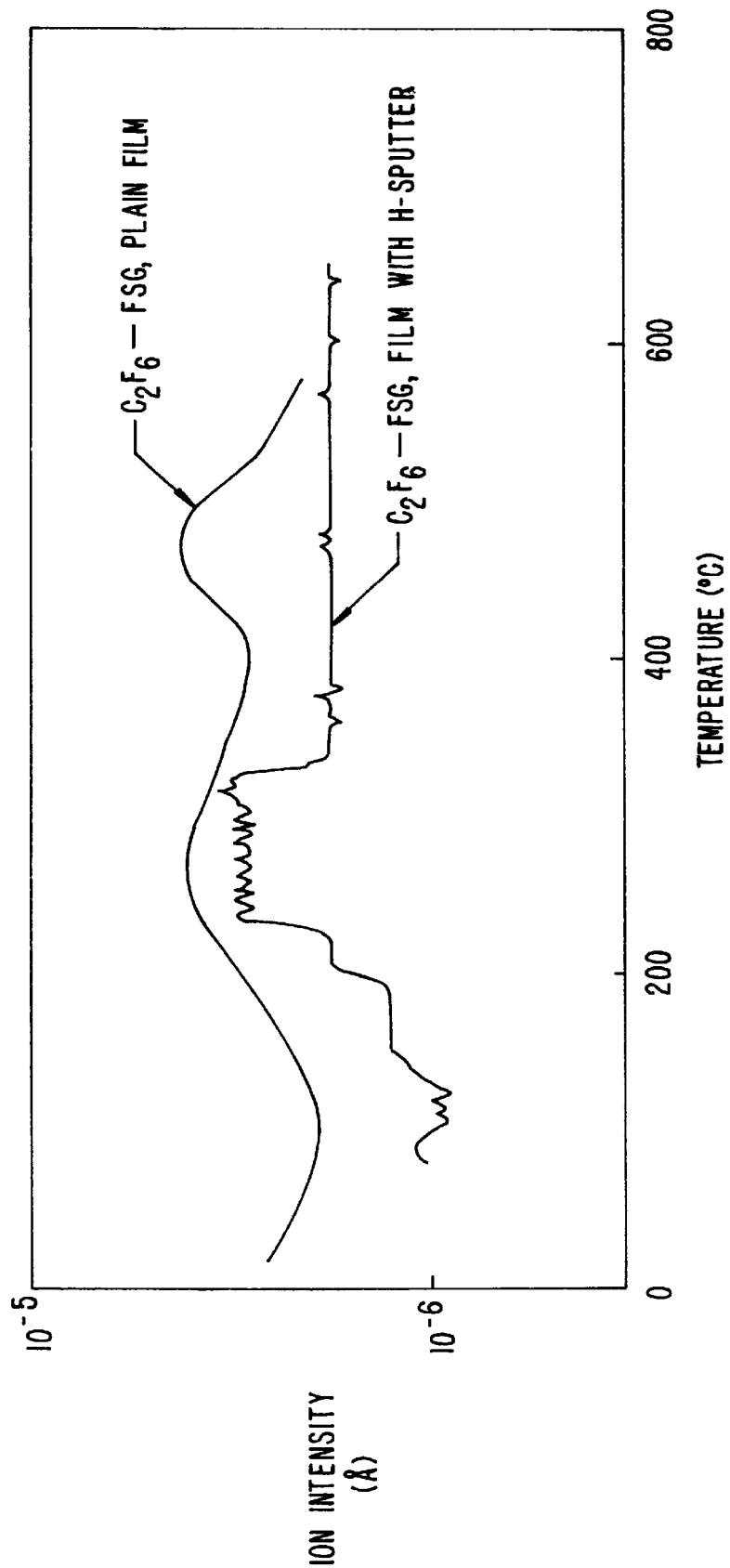
FIG. 10 is a graph comparing $H_2O$ evolution for an FSG film subject to hydrogen bombardment and an FSG film not subject to hydrogen bombardment.

Evidence of the benefits of a hydrogen post-treatment plasma step on an FSG film is evident from FIG. 10, which is a graph comparing the evolution of $H_2O$ as a function of temperature in treated and untreated FSG films based on thermal desorption spectroscopy (TDS) as well understood by those of ordinary skill in the art. FIG. 10 compares the evolution of $H_2O$ (electron mass of 18) in an untreated FSG film to the evolution of $H_2O$ in a film treated with a hydrogen plasma post-treatment step of 60 seconds. The plotted TDS data shows that $H_2O$ evolution occurs at two intervals in the untreated FSG film. The first interval, which represents evolution of moisture absorbed by the film after deposition of the FSG layer occurs at approximately 150° C. It is believed that the $H_2O$ evolving at this temperature is $H_2O$ absorbed by the FSG layer while the film was exposed to ambient conditions for 48 hours prior to having the TDS data plotted.

The second interval in FIG. 4 represents the evolution of loosely bound $H_2O$ from the bulk of the FSG film. $H_2O$ evolution at this interval begins at approximately 400° C. and peaks at approximately 450° C.

In contrast, the FSG film treated with hydrogen post-treatment plasma only has one instance of $H_2O$ evolution. The TDS data for this film shows that moisture absorbed by the film after the hydrogen plasma treatment step is released as approximately 150° C. As above, it is believed that this moisture is present in the film because the film was exposed to ambient conditions for 48 hours prior to having the TDS data plotted. As shown in FIG. 4 though, there is no second interval of $H_2O$ evolution. The hydrogen plasma treatment previously removed the loosely bound fluorine atoms from the FSG layer.

Having fully described several embodiments of the present invention, many other equivalent or alternative methods of depositing the low dielectric constant oxide layer according to the present invention will be apparent to those skilled in the art. For example, while most of the illustrated embodiments concerned fluorine-doped oxide layers, the present invention is also applicable to fluorine-doped nitride and similar films. These equivalents and alternatives are intended to be included within the scope of the present invention.

What is claimed is:

1. A process for depositing a layer on a substrate in a reactor, said process comprising:
   (a) depositing a halogen-doped silicon oxide film on said substrate from a reaction of reactants including silicon, oxygen and a halogen family member; and
   (b) thereafter, densifying said halogen-doped silicon oxide film by bombarding said film with ionic species from a plasma of an argon containing gas source.

2. A process for depositing a layer on a substrate in a reactor, said process comprising:
   (a) depositing a halogen-doped silicon oxide film on said substrate from a reaction of reactants including silicon, oxygen and a halogen family member; and
   (b) thereafter, forming a plasma from a hydrogen containing source gas to bombard said halogen-doped silicon oxide film with hydrogen ions to remove loosely bound halogen atoms from said halogen-doped silicon oxide film.

3. The process of claim 2 wherein said halogen-doped silicon oxide film is a fluoro silicate glass (FSG) film and wherein said halogen containing source comprises a fluorine containing source.

4. The process of claim 3 wherein substrate is heated to a temperature of between about 300–500° C. during treatment with said plasma of hydrogen ions.

5. The process of claim 3 wherein said plasma of hydrogen ions is formed at a pressure of between about 0.1–100 torr.

6. The process of claim 3 wherein said plasma of hydrogen ions is formed at a temperature of between about 400–430° C. and at a pressure of between about 50–100 torr.

7. The process of claim 6 wherein said hydrogen containing source gas is introduced into said reactor at a rate of between about 250–2000 sccm.

8. The process of claim 7 wherein said plasma of hydrogen ions is formed using high and low frequency RF sources.

9. The process of claim 3 wherein said FSG film is deposited by a plasma enhanced chemical vapor deposition process.

10. The process of claim 9 wherein said FSG film is formed from a plasma of TEFS, TEOS and oxygen.

11. The process of claim 9 wherein said FSG film is formed from a plasma of $C_2F_6$, TEOS and oxygen.

12. The process of claim 3 wherein said layer is formed over a plurality of adjacent metal lines formed on a semiconductor substrate.

13. The process of in claim 2 wherein said layer is between about 0.2–3.0 microns thick.

14. The process of claim 13 where said layer has a dielectric constant of between about 3.4 and 3.7.

15. The process of claim 3 wherein treatment of said layer with said plasma of hydrogen ions is performed immediately after deposition of said layer in an in-situ process.

16. The process of claim 3 wherein said FSG film is deposited at a temperature of between 350–500° C. and at a pressure of between 3–16 torr and wherein said plasma of hydrogen ions is formed at a temperature of between 360–440° C. and at a pressure of between 0.5–5 torr.

17. The process of claim 3 wherein said plasma treatment step bombards said FSG film with said ionic species for between about 20–100 seconds.

18. A process for depositing a layer on a substrate in a reactor, said process comprising:
   (a) depositing a fluorine-doped silicon oxide film on said substrate from a reaction of reactants including silicon, oxygen and fluorine; and
   (b) thereafter, bombarding said film with a hydrogen plasma for between about 10–500 seconds.

19. A process for depositing an insulating layer on a substrate in a 2 chamber, said process comprising the steps of:
   (a) heating said substrate to a temperature of between about 350–500° C.;
   (b) pressurizing said chamber to a pressure of between about 3–16 torr;
   (c) introducing TEOS, an oxygen containing source gas and a fluorine containing source gas into said chamber;
   (d) forming a plasma from said TEOS, said oxygen containing source gas and said fluorine containing source gas using a mixed frequency RF power supply to deposit a fluorosilicate glass (FSG) film on said substrate; and thereafter,
   (e) heating said substrate to a temperature of between about 400–480° C.;
   (f) pressurizing said chamber to a pressure of between about 50–100 torr;
   (g) introducing a hydrogen containing source gas into said chamber; and
   (h) forming a plasma from said hydrogen containing source gas using a mixed frequency RF power supply to remove loosely bound fluorine atoms from an upper surface of said FSG film.

20. A process for depositing a layer on a substrate in a reactor, said process comprising:
   (a) depositing a halogen-doped silicon oxide film on said substrate from a reaction of reactants including silicon, oxygen, and a halogen element; and (b) thereafter, improving the stability of said halogen-doped silicon oxide film by bombarding said film with ionic species from a plasma of either an inert gas or hydrogen.

21. The process of claim 20 wherein said ionic species are formed from a plasma of a hydrogen containing source.

22. The process of claim 20 wherein said ionic species are formed from a plasma of an inert gas containing source.

23. The method of claim 20 wherein said halogen-doped silicon oxide film is a fluoro silicate glass film and wherein said halogen element is fluorine.

24. The method of claim 1 wherein said halogen-doped silicon oxide film is bombarded by said argon plasma for between about 10–500 second.

25. The method of claim 1 wherein said halogen-doped silicon oxide film is a fluoro silicate glass film and wherein said halogen family member is fluorine.

26. A process for depositing a layer on a substrate in a reactor, said process comprising:
   (a) depositing a fluorine-doped silicon oxide film on said substrate from a reaction of reactants including silicon, oxygen and fluorine; and
   (b) thereafter, bombarding said film with a hydrogen and nitrogen plasma for between about 10–500 seconds.

27. The method of claim 26 wherein said hydrogen and nitrogen plasma is formed from a flow of ammonia ($NH_3$).

* * * * *